United States Patent [19]
Hshieh et al.

[11] Patent Number: 5,907,169
[45] Date of Patent: May 25, 1999

[54] SELF-ALIGNED AND PROCESS-ADJUSTED HIGH DENSITY POWER TRANSISTOR WITH GATE SIDEWALLS PROVIDED WITH PUNCH THROUGH PREVENTION AND REDUCED JFET RESISTANCE

[75] Inventors: Fwu-Iuan Hshieh, Saratoga; True-Lon Lin, Cupertino; Koon Chong So, San Jose, all of Calif.

[73] Assignee: MegaMOS Corporation, San Jose, Calif.

[21] Appl. No.: 08/844,165

[22] Filed: Apr. 18, 1997

[51] Int. Cl.⁶ ..................................... H01L 29/76
[52] U.S. Cl. .......................... 257/262; 257/286; 257/328; 257/335
[58] Field of Search ................................... 257/335, 328, 257/262, 286, 333, 287

[56] References Cited

U.S. PATENT DOCUMENTS

| | | | |
|---|---|---|---|
| 4,960,723 | 10/1990 | Davies | 437/41 |
| 5,273,922 | 12/1993 | Tsoi | 257/335 |
| 5,504,360 | 4/1996 | Tokura et al. | 257/342 |
| 5,563,437 | 10/1996 | Davies et al. | 257/329 |

*Primary Examiner*—Donald L. Monin, Jr.
*Attorney, Agent, or Firm*—Bo-In Lin

[57] ABSTRACT

The present invention discloses a MOSFET transistor supported on a substrate. The MOSFET transistor includes an epitaxial-layer of a first conductivity type near a top surface of the substrate defining a drain region therein. The MOSFET transistor further includes an oxide block supported on a raised silicon terrace of the epitaxial layer disposed in a central portion of the transistor above a JFET reduction region of a first conductivity type of higher dopant concentration than the epitaxial layer. The MOSFET transistor further includes a lower-outer body region of a second conductivity type surrounding the JFET reduction region disposed near the top surface and defining a boundary of the MOSFET transistor. The MOSFET transistor further includes a source region of the first conductivity type enclosed in the lower-outer body region disposed near the top surface and extended to the transistor boundary. The MOSFET transistor further includes a thin gate oxide layer overlying the top surface of the substrate and an edge of the raised oxide terrace. The MOSFET transistor further includes a polysilicon gate overlaying the oxide block and the silicon terrace, the gate further covering an area above the source region and the body region insulated by the gate oxide layer therefrom.

20 Claims, 9 Drawing Sheets

SELF-ALIGNED AND PROCESS-ADJUSTED HIGH DENSITY POWER TRANSISTOR WITH GATE SIDEWALLS PROVIDED WITH PUNCH THROUGH PREVENTION AND REDUCED JFET RESISTANCE

BACKGROUND OF THE INVENTION

1. Field of the Invention

This invention relates generally to the structure and fabrication process of semiconductor transistors. More particularly, this invention relates to a novel and improved structure and manufacture process for a high density shallow junction semiconductor power device which has improved punch through prevention characteristics, maintaining a low JFET resistance, achieving higher switching speed while manufactured with a process flow without requiring the use of a polysilicon mask for one of the preferred embodiments.

2. Description of the Prior Art

The requirement to allow extra width to compensate for potential misalignment errors in power transistor manufacture often becomes a major difficulty in an effort to reduce the critical dimensions in order to make power transistors of higher density. In addition to the difficulties caused by the alignment imprecision, there are several other technical difficulties now encountered by those of ordinary skill in the art. Specifically, the dimensions of the polysilicon layer between the cells are shrunk when the cell density is increased. The shrinking dimensions of a polysilicon layer, i.e., the reduction in widths of the polysilicon gates, between the cells often generates a higher JFET resistance. In order to deal with the increased JFET resistance for a power device with higher cell density, shallow junctions are formed for the semiconductor power device. A semiconductor power device of shallow junction is however subject to a potential punch through problem. Damages to device may arise to a shallow junction device when a punch through occurs even such device can provide the advantage that the JFET resistance is reduced. Various structure features are implemented as will be discussed below to prevent the occurrence of a punch through. However, such punch through prevention features often lead to increase in JFET resistance, particularly for devices where the cell sizes are further reduced.

These technical difficulties cannot be conveniently resolved as illustrated by many prior art patents where attempts are made to solve one problem while causing other related problems to become worse. Further reduction of cell size to increase the cell density for the semiconductor power devices seems to be hindered by several related technical concerns. Unless these related difficulties can be effectively resolved, product reliability problems and device malfunctions caused by these difficulties would limit our capability to manufacture the semiconductor power device with higher density than which have been now achieved.

In U.S. Pat. No. 5,479,037 entitled "Low Threshold Voltage Epitaxial DMOS Technology" Hshieh et al. disclose a threshold power DMOS transistor structure which has a lightly doped channel region formed in a shallow layer of relatively lightly doped epitaxial silicon (referring to FIG. 1). The lightly doping of the shallow epitaxial layer minimizes variations in threshold voltage and local variations in punch through susceptibility due to non-uniformity in epitaxial doping concentration. A relatively heavy doped epitaxial layer is disposed underneath the shallow lightly doped epitaxial layer is located below the channel region to reduce the drain to source resistance. Because the heavily doped epitaxial region is located below the channel region and not in the regions of the structure mostly susceptible to body region punch through, the deep heavily doped regions would not cause the threshold voltage variations.

Even that advantages of low threshold voltage and punch through prevention can be achieved by lightly doping a epitaxial shallow layer for a DMOS device, Hshieh's DMOS formed on a substrate with shallow lightly doped epitaxial layer leads to another difficulty when the DMOS cell density is further increased. When the DMOS cells are being placed closer to each other, the lightly doped epitaxial layer causes the JFET resistance to increase due to the smaller JFET regions between the cells which are now manufactured with a lower dopant concentrations. The usefulness of this DMOS structure with lightly doped epitaxial layer is limited due to this difficulty when the cell size is further reduced with increased cell density.

In U.S. Pat. No. 5,404,040 entitled "Structure and Fabrication of Power MOSFET Including Termination Structure", (issued on Apr. 4, 1995) Hshieh et al. disclose a semiconductor power MOSFET device having a main active area and a peripheral termination area. The power MOSFET includes a first insulating layer of substantially uniform thickness lies over the active and termination areas. The main polycrystalline portion lies over the first insulating layer largely above the active area. A first and a second peripheral polycrystalline segments lie over the first insulating layer above the termination area. A gate electrode contacts the main polycrystalline portion. A source electrode contact the active area, the termination area and the first polycrystalline segment. An optional additional metal portion contacts the second polycrystalline segments. The power MOSFET is manufactured by a five mask process. This device provides a unique termination structure for a power MOSFET by dividing the device into a main active area and a peripheral termination area and the first insulating layer is of substantial uniform thickness of about 100–1000 Angstroms overlies the termination and the active area. Due to this thin oxide layer structure, particularly underneath the field plate, the MOSFET device may encounter a walk-out problem when the voltage applied to the field plate exceed a certain limit. Furthermore, this thin oxide layer between two peripheral polycrystalline silicon segments may be incidentally etched away in the manufacture process. A reliability problem may be induced when the etch process is not very precisely controlled. The production costs are increased due to this special manufacture precision requirement.

Therefore, a need still exists in the art of power device structure and fabrication to provide a new device structure and manufacturing method, particularly to those engaged in semiconductor power device design and fabrication of higher cell density to resolve these difficulties and limitations. It is desirable that the novel device structure and fabrication method can be implemented with self-aligned and automatic process-adjusted body regions such that the novel structure would enable those of ordinary skill in the art to further reduce the cell size to achieve higher cell density. In the meantime, it is also desirable that while overcoming these limitations and difficulties, cost savings and better reliability can be achieved when simplified manufacture process with less number of masks when the novel structure and manufacture processes are implemented.

SUMMARY OF THE PRESENT INVENTION

It is therefore an object of the present invention to provide a novel and improved MOSFET structure, and fabrication process to overcome the aforementioned difficulties encountered in the prior art.

Specifically, it is an object of the present invention to provide a novel MOSFET structure and fabrication process where the structural features for punch through prevention and reduction of JFET resistance can be implemented with cells of reduced critical dimensions without causing a potential concern that the threshold voltage may be increased due to structural deviations of the body regions caused by cell size reduction or errors induced by mask misalignment.

Another object of the present invention is to provide a novel and improved MOSFET structure and fabrication process where the structural features for punch through prevention and reduction of JFET resistance can be implemented with cells of reduced critical dimensions by providing and controlling the width of a sidewall around a gate whereby the potential problems of threshold voltage increase due to structural deviations of the body regions are eliminated when the sidewalls are used to assure the body regions will not diffuse into a gate-insulated region.

Another object of the present invention is to provide a novel and improved MOSFET structure and fabrication process where the structural features for punch through prevention and reduction of JFET resistance can be implemented with cells of reduced critical dimensions by providing an automatic process-adjusting and self alignment sidewall gate structure such that the potential concern of threshold voltage increase due to structural deviations of the body regions caused by cell size reduction or errors induced by mask misalignment are eliminated.

Another object of the present invention is to provide a novel and improved MOSFET structure and fabrication process where the structural features for punch through prevention and reduction of JFET resistance can be implemented with cells of reduced critical dimensions by providing an automatic process-adjusting and self alignment sidewall gate structure wherein cost savings can be achieved because a polysilicon mask is not required in the fabrication process.

Another object of the present invention is to provide a novel and improved MOSFET structure and fabrication process where the structural features for punch through prevention and reduction of JFET resistance can be implemented with cells of reduced critical dimensions by providing an automatic process-adjusting and self alignment sidewall gate structure such that the cell size can be further reduced without being limited by the difficulties of allowing extra gate lengths to compensate the error induced by mask misalignments.

Briefly, this invention discloses a preferred embodiment which is MOSFET transistor on a substrate with specially configured gate structure to provide punch through prevention and reduced JFET resistance while allowing the cell size to be further reduced. According to the present invention, the method of manufacturing this transistor includes the steps of: (a) forming an epitaxial layer of a first conductivity type on a the substrate which function as a common drain region for the transistor and then implanting a JFET resistance reduction layer on top of the epitaxial layer with ions of the first conductivity type followed by growing an initial oxide layer over the JFET resistance reduction layer; (b) applying an active layer for etching away the initial oxide to define an active area and to form a plurality of oxide blocks on the substrate by etching a certain depth into the epitaxial layer near the oxide blocks followed by implanting a plurality of implanting zones for punch through prevention adjacent to the oxide blocks with dopant of a second conductivity type; (c) depositing an overlaying polysilicon layer and applying a polysilicon mask for an-isotropically etching the polysilicon layer to define a plurality of polysilicon gates with each of the polysilicon gates overlying one of the oxide blocks thereunder and forming a sidewall around the oxide blocks extending laterally a sidewall width therefrom; (d) removing the polysilicon mask for carrying out a body implant of a body dopant of the second conductivity type followed by performing a body diffusion for forming a plurality of body regions wherein the sidewall width surrounding the gate is equal to or greater than a lateral diffusion length of the body dopant whereby the body regions is formed away from the oxide blocks underneath the gate; (e) employing a source mask for implanting a plurality of source regions in the body regions with ions of the first conductivity type; and (f) forming an insulation layer and applying a high temperature process for densification of the insulation layer and for activating a diffusion of the source regions wherein a punch through prevention is provided with reduced JFET resistance while maintain the body regions away from the oxide blocks to keep a low threshold voltage.

In an alternate preferred embodiment, a method for fabricating an alternate MOSFET device is provided which includes the steps of: (a) forming an epitaxial layer of a first conductivity type on a the substrate which function as a common drain region for the transistor and then implanting a JFET resistance reduction layer on top of the epitaxial layer with ions of the first conductivity type followed by growing an initial oxide layer over the JFET resistance reduction layer; (b) applying an active layer for etching away the initial oxide to define an active area and to form a plurality of oxide blocks on the substrate by etching a certain depth into the epitaxial layer near the oxide blocks followed by implanting a plurality of implanting zones for punch through prevention adjacent to the oxide blocks with dopant of a second conductivity type; (c) depositing an overlaying polysilicon layer and applying an anisotropic etching to form a self aligned sidewall spacer around the edge of the oxide blocks as polysilicon gate; the polysilicon layer to define a plurality of polysilicon gates with each of the polysilicon gates overlying one of the oxide blocks thereunder while leaving one oxide block between every two neighboring gates wherein the polysilicon mask being configured not covering the gates thus each of the gates is formed as an anisotropically etched sidewall surround an edge of the oxide block whereby the sidewalls surrounding the oxide blocks being formed by a process-adjusted anisotropic etch process; (d) carrying out a body implant of a body dopant of the second conductivity type followed by performing a body diffusion for forming a plurality of body regions wherein the body regions are formed away from the oxide blocks underneath the gate whereby an increase in the threshold voltage is prevented;(e) forming a silicide layer over the polysilicon sidewall spacers; (f) employing a source mask for implanting a plurality of source regions in the body regions with ions of the first conductivity type; and (g) forming an insulation layer and applying a high temperature process for densification of the insulation layer and for activating a diffusion of the source regions wherein a punch through prevention is provided with reduced JFET resistance while maintain the body regions away from the oxide blocks to keep a low threshold voltage and eliminating the misalignment error of the polysilicon mask by employing a process-adjusted anisotropic etching process in forming the sidewall gates along each of the oxide blocks.

In yet another preferred embodiment, oxide or nitride sidewall spacers are formed surrounding the polysilicon gates functioning as implant block to body dopants such that the width of the polysilicon gates can be further reduced because the body regions are being blocked from a certain distance away from the JFET regions under the gates. Higher cell density is achievable with reduced JFET resistance and punch through prevention are provided by implementing the novel structural features of this embodiment.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIGS. 4A to 4E are a series of cross sectional views for illustrating the processing steps for fabricating the MOSFET device of FIG. 3;

DETAILED DESCRIPTION OF THE PREFERRED EMBODIMENT

Figure 1:
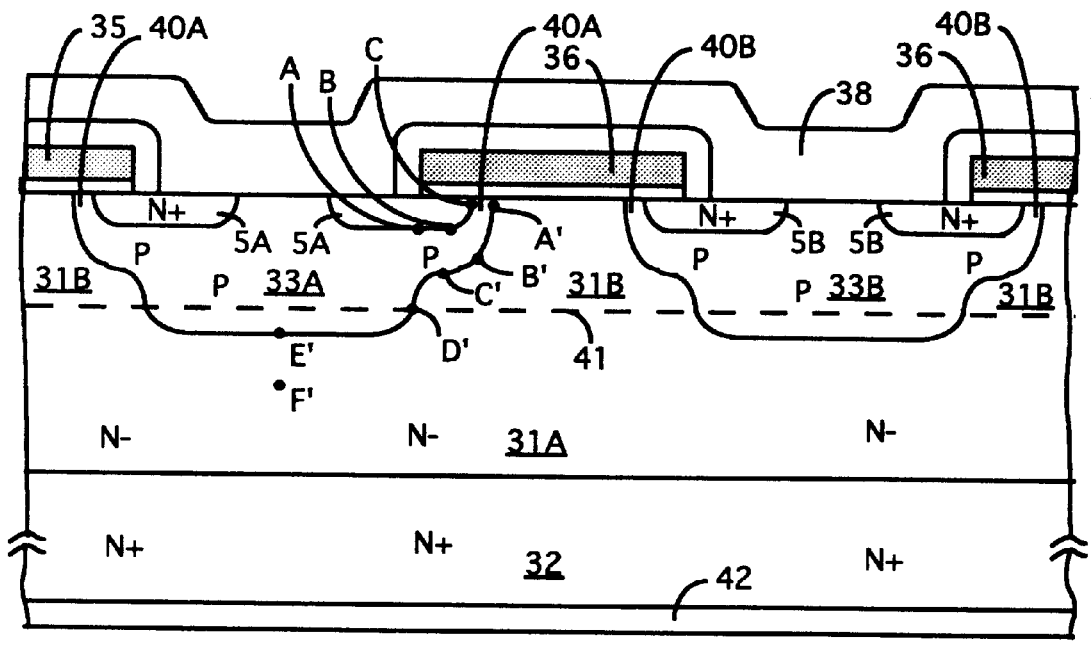
FIG. 1 is a cross-sectional view of a prior art structure of a MOSFET transistor formed with punch through prevention structure.
Figure 2:
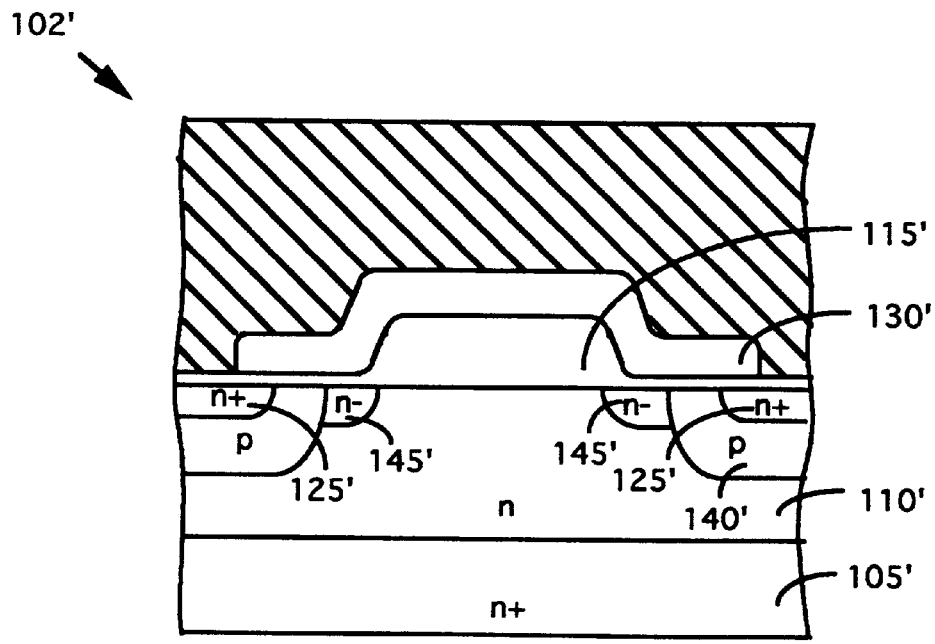
FIG. 2 is a cross-sectional view of a MOSFET structure of another Patent Application provided with improved punch through prevention structure without affecting the JFET resistance.

In order to better appreciate the advantage of the present invention, a brief description of a MOSFET cell of a Copending Patent Application assigned to the same Assignee is provided here for comparison purpose. The structural features of this Copending Application are provided to improve the punch through prevention without increasing the JFET resistance which are invented by the Applicants of this invention and assigned to the same Assignee of this invention. The Copending Application filed on Mar. 11, 1997. Referring to FIG. 2 for a cross sectional view of a transistor cell 102' disclosed in the Copending Application which shows an exemplary N-channel MOSFET transistor cell 102' of a MOSFET device. The MOSFET transistor cell 102' is formed on a N+ substrate 105' supporting a N epitaxial layer 110' thereon. The N+ substrate serves as a common drain for the transistor cells 102' of the MOSFET device. The MOSFET transistor cell 102' includes a lower-outer p-body region 140' formed in a greater depth into the epitaxial layer 110'. The lower outer p-body 140' surrounds the transistor cell 102' and substantially defining an outer boundary thereof. A shallower N+ source region 125" is formed inside the p-body region 140' adjacent to the outer boundary of the transistor cell 102'. A shallower N− doped punch through prevention region 145' is disposed adjacent the p-body region 140'.

For the structural features of the central portion of the transistor cell 102' where an implant oxide block 115' is supported on the epitaxial layer 110'. The implant oxide blocks 115' in turn supports a polysilicon gate 130'. The polysilicon gate 130' formed above the oxide block 115' is formed to extend beyond the edge of the oxide block 115' to a distance greater than the lateral diffusion of the body dopant ions. A gate of certain length requirement is necessary because the concern that if the gate 130' does not cover an area laterally extend beyond a lateral diffusion length of the body dopant ions, the likelihood exists where the body dopant may diffuse to a region underneath the oxide blocks 115' thus the oxide blocks 115' insulate the body regions 140 from the gate 130'. The threshold voltage of this transistor cell is increased when such condition occurs. Therefore, with this structural features, the length of the polysilicon gate 130' is required to maintain at a certain minimum value. Furthermore, the concern that alignment of the polysilicon mask for patterning the polysilicon gates may not be precisely performed. To allow for possible misalignment and to prevent increase of threshold voltage when such misalignment occurs, the polysilicon gates are formed with extra lengths to compensate for these limitations. Therefore, when a structure such as that shown in FIG. 2 is employed, increase of the cell density of the MOSFET device is limited due to these intrinsic dimensional limitations imposed on cells of this structure.

Figure 3A:
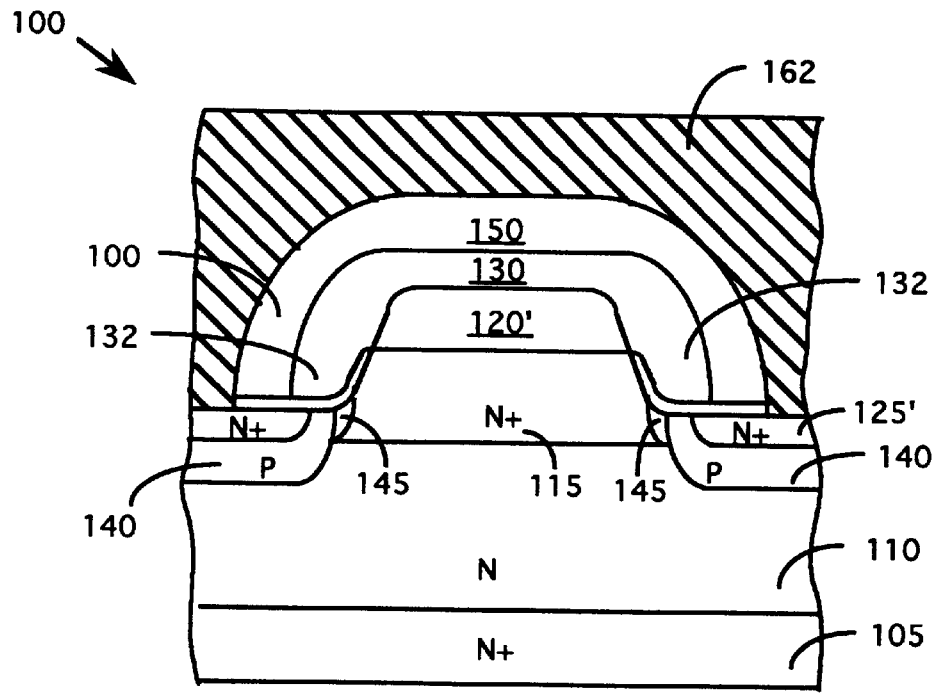
FIGS. 3A and 3B are a cross-sectional views of a MOSFET device provided with punch through prevention, JFET resistance reduction and transistor cell size reduction by the use of a silicon terrace structure of the present invention.

FIG. 3A shows the cross sectional view of a preferred embodiment of the present invention wherein an exemplary N-channel MOSFET transistor cell 102 as part of a MOSFET device is depicted. The MOSFET transistor cell 102 is formed on a N+ substrate 105 supporting a N epitaxial layer 110 thereon. The N+ substrate serves as a common drain for the transistor cells 102. The MOSFET transistor cell 102 includes a lower-outer p-body region 140 formed in a greater depth into the epitaxial layer 110. The lower outer p-body 140 surrounds the transistor cell 102 and substantially defining an outer boundary thereof. A shallower N+ source region 125' is formed inside the p-body region 140 adjacent to the outer boundary of the transistor cell 102. In the central potion of the transistor cell, a N+ doped JFET resistance reduction region 115 extends laterally between the outer p-body region 140 with a shallower N− doped punch through prevention region 145 disposed between the JFET resistance reduction region 115 and the p-body region 140.

Figure 3B:
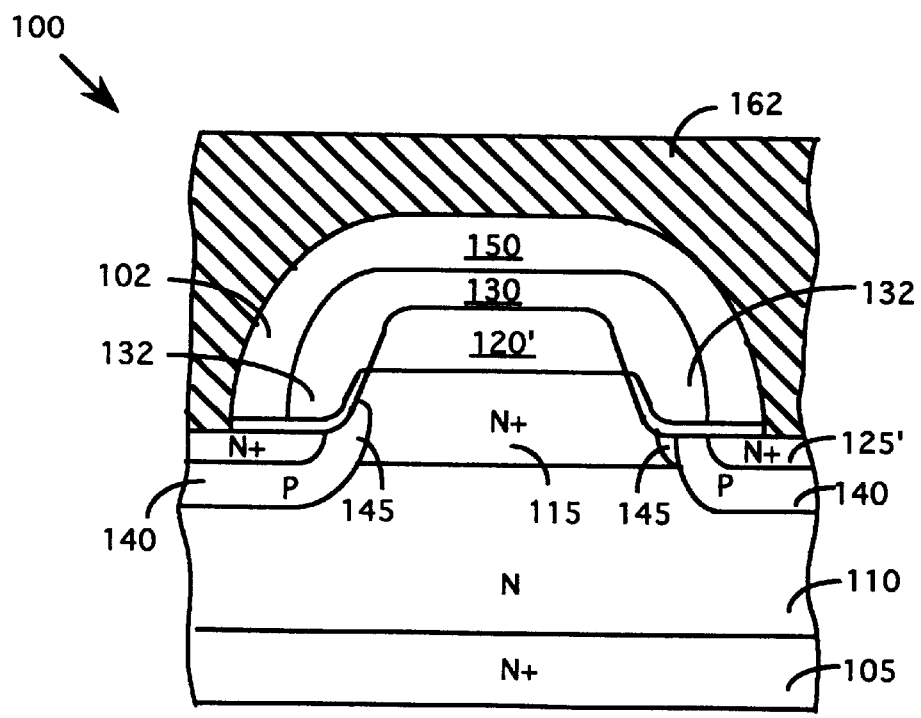

Special attention should be paid to the structural features of the central portion of the transistor cell 102 where the JFET resistance reduction region 115 and the portion of the epitaxial layer 110 underneath form a raised silicon terrace with a vertical height δ above the top surface of other areas of the epitaxial layer 110. The raised silicon terrace supports an oxide block 120' with a polysilicon gate 130 overlying the oxide block 120'. Referring to FIG. 3B for the benefits provided by this special cell configuration. FIG. 3B shows an identical transistor cell as that of FIG. 3A with the exception that the polysilicon mask is misaligned by a distance α where α is the upper limit of the controllability of the misalignment errors. Accordingly, FIG. 3B shows a structural profile for the transistor cell when a worst misalignment of the polysilicon mask has occurred. Due to the misalignment, the p-body region 140 is also shifted by an approximate distance of α. Under a normal structure without the raised silicon terrace the p-body would have been formed under the thick oxide block 120' thus causing the threshold voltage to raise. With the raised terrace as shown, there is a portion of the thin gate oxide layer 132 underneath the gate 130 along the edge of the raised terrace which is in close contact with the p-body region 140. The p-body region 140 is prevented from touch the thick oxide blocks thus causing the threshold voltage to increase. Instead, the p-body region 140 is diffused to touch the thin gate oxide layer 132 along the edge portions of the raised terrace. Therefore, the manufacture requirement to control the critical dimensions typically along a horizontal direction, e.g., controlling the misalignment errors, are now translated to a vertical critical dimension tolerance requirement to control the vertical height of the raised silicon terrace δ to assure that sufficient height of the silicon terrace is maintain without raising the threshold voltage assuming a worst misalignment error has occurred. By translating a horizontal critical dimension tolerance requirement to a vertical critical dimension tolerance requirement, the size of the transistor can be further reduced to increase the cell density without being limited by the manufacture capability of controlling the horizontal critical dimensions.

With the body region 140 and the source region 125' formed in a lower plane, i.e., lower by a vertical distance δ below the raised terrace, the technical difficulty caused by the concern that the p-body 140 extends laterally below the oxide block 120' and causing the increase of threshold voltage is now resolved. The MOSFET cell 102 as that shown in FIG. 3 provides several further advantages. It has a strengthened punch through prevention with the punch through prevention region 145 and also achieving a lower JFET resistance by providing a JFET resistance reduction region 115 extending laterally between the p-body region 140. The JFET region 115 is kept shallower than the p-body region 140 and an early avalanche break down which commonly occurs at the p-body corner is prevented. The transistor cell 102 further provides faster switching speed because the capacitance between the gate and drain $C_{GD}$ is reduced with the oxide block 120' disposed underneath the polysilicon gate 130. Most significantly, the cell density can be further increased by reducing the length of the polysilicon gate 130 without being limited by the technical difficulty that the body dopant may diffuse into the region underneath the oxide block 120' thus causing high threshold voltage. These advantages can be better appreciated by referring to the detail description of the processing steps for fabricating the MOSFET device provided below.

Figure 4A:
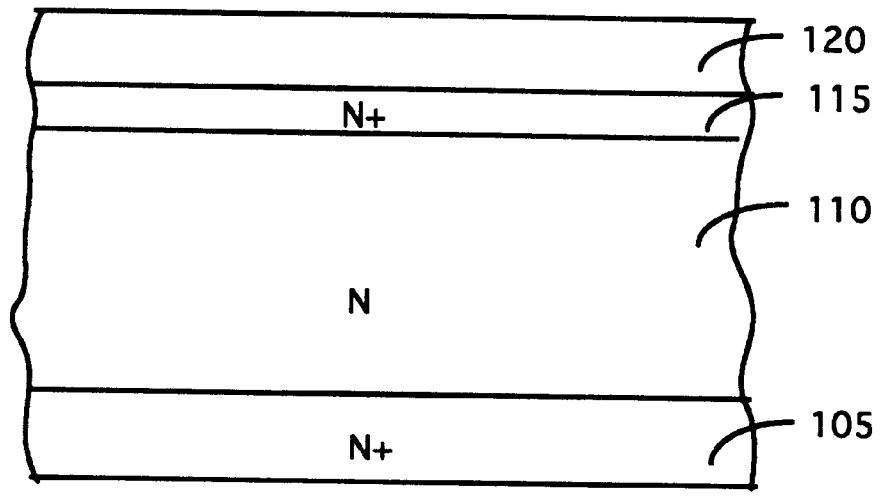

Please refer to FIGS. 4A to 4H for the processing steps for manufacturing the power MOSFET device 100 includes a plurality of transistor cells 102 described above. As shown in FIG. 4A, the processing steps begins by first growing a N epitaxial layer 110 with a resistivity ranging from 0.1 to 1.0 ohm-cm on top of a N+ substrate 105. The substrate has a resistivity of 0.001 to 0.007 ohm-cm. The thickness and the resistivity of the epitaxial layer 110 depend on the device requirements for the on-resistance and breakdown voltage. In a preferred embodiment, the thickness of the epi-layer 110 is about three to twenty microns (3–20 μm). A N+ layer 115 of a thickness ranging from 0.2–1.0 μm is formed by carrying out an arsenic or phosphorous implant with implanting ions at 20–100 Kev with an ion beam of $1\times10^{11}$ to $1\times10^{13}/cm^2$ flux density to form the N+ JFET reduction layer 115. An initial oxidation process is performed to grow an oxide layer 120 ranging from 4,000 to 10,000 Å.

Figure 4B:
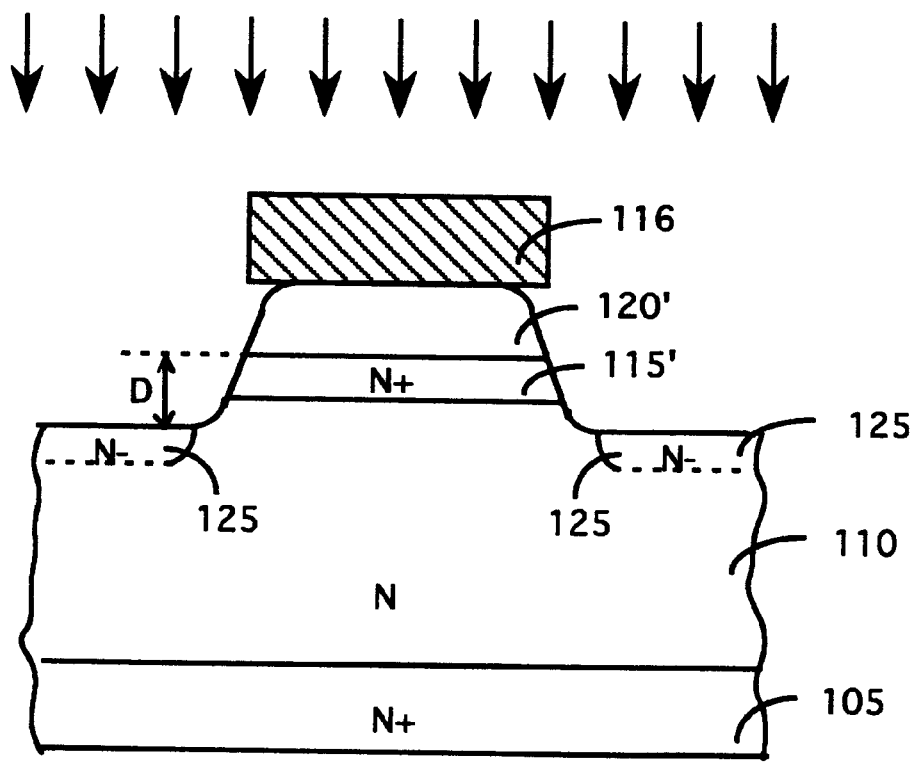

Referring to FIG. 4B, a specially configured active mask is employed to form a photoresist layer 116 and, in the core cell area, the dry etch also is applied to etch the initial oxide 120 thus forming a plurality of oxide blocks 120'. In defining the oxide blocks 120', the dry etch is employed to etch into the silicon for a depth of 0.2 to 0.6 μm. Thus, in the areas not covered by the photo resist 116 and the oxide blocks 120', the N+ JFET resistance reduction layer 115 and a top portion of the epitaxial layer 110 are removed. The depth, i.e., δ, for etching into the silicon depends on the equipment controllability of the critical dimension (CD) and the precision of the alignment as will be further explained below. A plurality of oxide blocks 120' are thus formed each is supported on a raised silicon terrace 110' with a height of δ. A low flux punch through prevention implant is then carried out by implanting boron ions at 30–100 Kev with an ion beam of $1\times10^{12}$ to $1\times10^{13}/cm2$ flux density to reduce the dopant concentration in the punch through implant zones 125 thus forming a plurality of N⁻ punch through implant zone 125 in the N-epitaxial layer 110.

Figure 4C:
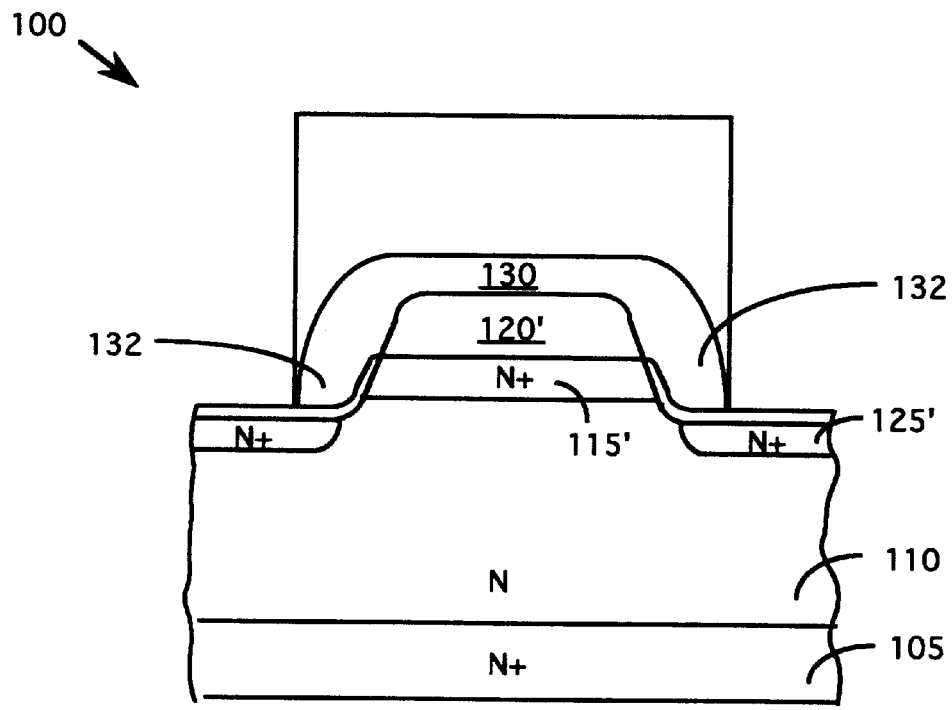

Referring to FIG. 4C, after the photo-resist 116 is removed and a layer of oxide layer 132 is grown, a polysilicon layer 130 is deposited over the top surface of the oxide blocks 120'. A POCL₃ doping process is carried out followed by an As-implant process with an ion beam of energy 60–80 Kev with a flux density of 5 to $8\times10^{15}/cm^2$. A specially configured polysilicon mask is then applied to carry out an anisotropic etching process to define the polysilicon gates. The anisotropic etching process provides a much greater vertical etching rate than the horizontal etching rate such that the gate 130 is formed with very little undercut. As described above, the raised silicon terrace 110' with a height of δ and a thin gate oxide layer 132 formed along the edge, provides an extra margin for preventing the p-body region 140 from extending to a region in contact with the oxide block thus causing the MOSFET transistor cell to have a high threshold. Instead, the p-body region 140 is diffused to touch the thin gate oxide layer 132 along the edge portions of the raised terrace. The raised terrace 110' thus provides a special advantage of translating a horizontal critical dimension tolerance typically encountered in the integrated circuit manufacture to a vertical critical dimension. Further reduction of the cell size over the horizontal direction can be achieved because of the horizontal to vertical translation.

After the photo-resist for gate etching process is stripped, a p-body implant at 30–100 Kev with a boron ion-beam of $3\times10^{13}$ to $3\times10^{14}/cm^2$ flux density is carried out to form the p-body region 140. A p-body diffusion process is then carried out at an elevated temperature of 1,000–1,200° C. for ten minutes to three hours to increase the depth of the p-body region 140 to 1.0–2.0 μm. With the gate oxide layer 132 formed along the edge of the raised terrace 110', extra margins are provided for the p-body region 140 to be controlled by the gates 130 through the thin gate oxide layer 132 along the edge of the raised terrace 110' without being limited by the potential problem that the p-body may be diffused to a region in contact with the oxide block 120 thus causing the threshold voltage to increase. By eliminating the potential problems of a higher threshold voltage caused by horizontal misalignment, this invention provides a technique to further reduce the horizontal critical dimension and accordingly the cell size such that higher cell density can be achieved.

After forming the body regions 140, the next step is to form the source regions. A source mask is applied to define the source implant regions. A N+ implant, preferably with arsenic (As) ions, with an ion beam at energy between 60 to 100 Kev and an ion flux density of $5 \times 10^{15}$ to $1 \times 10^{16}$/cm$^2$ is performed to form the N$^+$ region 125'. A plurality of punch through prevention N$^-$ zones 145 are also formed underneath the gates 130 next to the body regions 140. The punch through prevention regions 145 are simultaneously formed in the core cell area with the N$^+$ source regions 125'. The punch through prevention N– regions 145 are formed with reduced dopant concentration because of the existing N-type dopant concentration is lessened by the punch through prevention implant of the boron ions into these regions, i.e., from the previous boron ion implant into the punch through implant regions 125. It is to be noted that unlike the prior art structure, the punch through prevention regions 145 which are N$^-$ regions with reduced dopant concentration, are formed without adversely affecting the JFET resistance. Because the punch through prevention regions 145 are separated by the oxide blocks 120' underneath the gates 130, not only that the JFET resistance is not increased with the punch through prevention regions 145, lower JFET resistance is achieved because the JFET regions between two body regions underneath the gates 130 are doped with higher source type dopant concentration thus forming a JFET resistance reduction region 115 thereunder.

Therefore, the structure now disclosed by this invention provides improved punch through prevention and meanwhile achieving lower JFET resistance. Additionally, the difficulty encountered with high density cells that an increase of threshold voltage may occur due to an undesirable situation when the p-body regions may incidentally diffuse laterally to a region underneath the thick oxide blocks 120' beneath the gate 130 is resolved. After the source mask is removed, the N$^+$ source regions 125' are driven into desired junction depth ranging from 02 to 0.6 $\mu$m by a diffusion process.

Figure 4D:
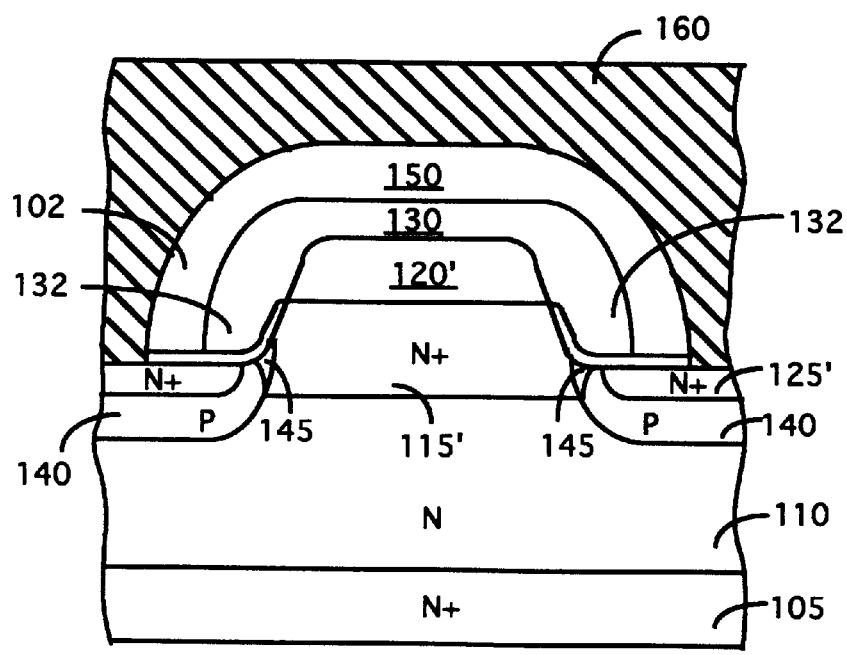

Referring to FIG. 4D, a BPSG or PSG insulating layer 150 is deposited to form a layer 150 of approximately 5000 to 15,000 Angstroms in thickness. A BPSG flow or PSG densificaion process is performed at 900–950° C. for thirty minutes to one hour. A contact mask is applied to perform an etching process to define the contact openings. A P+ ion implantation is carried out with boron flux at energy of 30–60 Kev having a ion flux density of $10^{15}$ to $2 \times 10^{15}$/cm$^2$, to form the P+ region 160 by a P+ activation process at 900–950° C. in an oxidation or inert gas ambient. The final power MOSFET device is completed with the metal deposition and metal etching by employing a metal mask to define the different electrode areas which are well known and not shown for the sake of clarity and brevity.

Figure 5A:
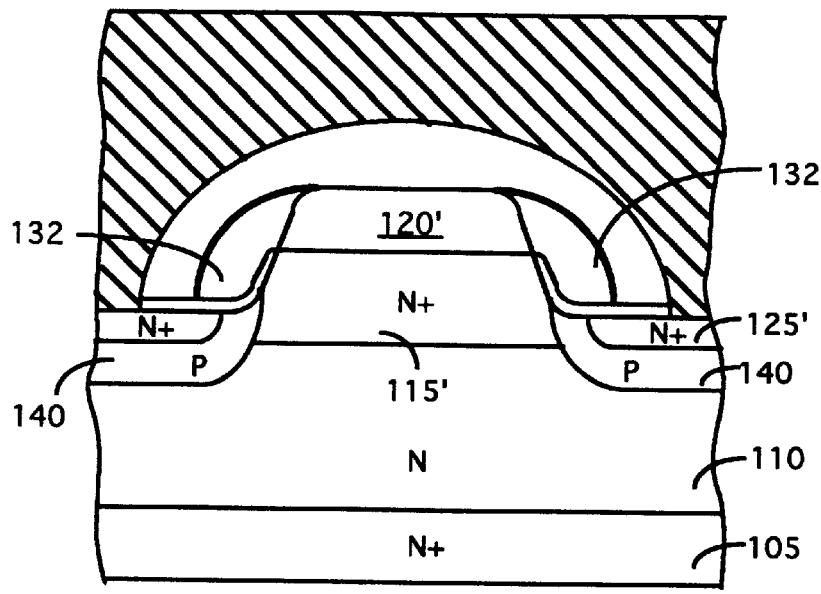
FIGS. 5A to 5C are cross sectional views of three alternate preferred embodiments of the present invention formed with sidewall gates and silicide gate cover for self-adjustment with controlled process in performing the gate formation and also self-alignment in forming the gates and the body regions.
Figure 5B:
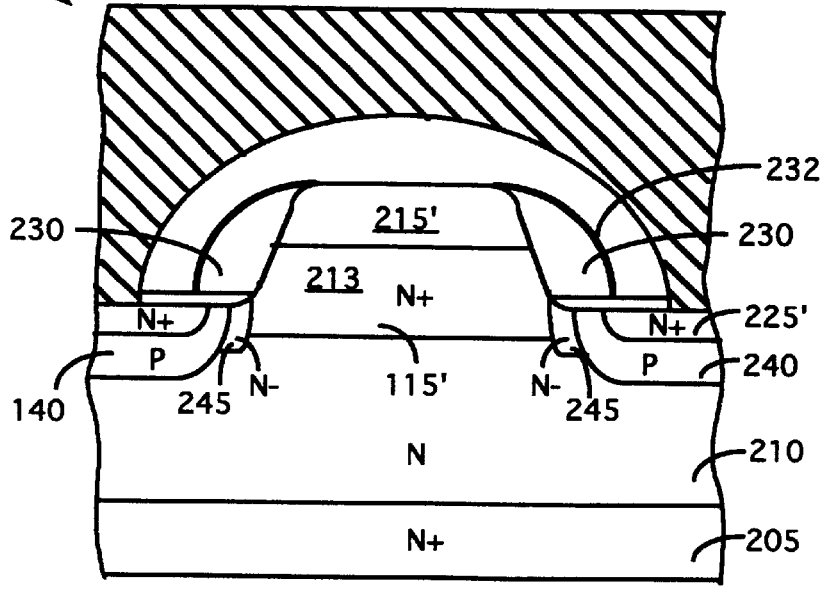

FIGS. 5A and 5B show the cross sectional view of two alternate preferred embodiments of the present invention. Referring to FIG. 5A first for an exemplary N-channel MOSFET transistor cell 202. The MOSFET transistor cell 202 is formed on a N$^+$ substrate 205 supporting a N epitaxial layer 210 thereon. The N$^+$ substrate serves as a common drain for the transistor cells 202 as part of a MOSFET device. The MOSFET transistor cell 202 includes a lower-outer p-body region 240 formed in a greater depth into the epitaxial layer 210. The lower outer p-body 240 surrounds the transistor cell 202 and substantially defining an outer boundary thereof. A shallower N$^+$ source region 225' is formed inside the p-body region 240 adjacent to the outer boundary of the transistor cell 204. In the central potion of the transistor cell, a N$^+$ doped JFET resistance reduction region 212 extends between the outer p-body region 240 with a shallower N$^-$ doped punch through prevention region 245 disposed between the JFET resistance reduction region 212 and the p-body region 240.

Special attention should be paid to the structural features of the central portion of the transistor cell 202 where the JFET resistance reduction region 212 and the portion of the epitaxial layer 210 underneath form a raised terrace with a vertical height $\delta$ above the top surface of other areas of the epitaxial layer 210. The raised terrace supports an oxide block 215' with a specially shaped sidewall spacer polysilicon gate 230 surrounding the oxide block 215'. The polysilicon gate 230 is an sidewall spacer gate 230 which includes a silicide layer 232 such as a titanium silicide layer having a thickness of approximately 500–1000 Angstroms overlying the polysilicon sidewall spacer gate 230. The sidewall spacer gate 230 has a width greater than the later diffusion length of the body dopant ions. The sidewall spacer gate 230 is formed by a dry etch process. The process of forming such a structure will be further described in more details below (please see description provided below for FIGS. 6A to 6D).

Similar to a power transistor cell as that shown in FIG. 3A, with the JFET resistance reduction region 212 and a portion of the epitaxial layer 210 formed as a raised terrace above the top surface of other areas on the epitaxial layer 210, the advantage of translating the horizontal critical dimension tolerance to vertical critical dimension tolerance is also realized in this device structure. Just like the first preferred embodiment shown in FIG. 3, under the circumstances when the p-body regions 240 extend to the regions underneath the oxide block 215', the threshold voltage of the device will not be increased because extra margins along the edge of the raised silicon terrace with thin gate oxide layer is provided which prevent the body region from extending to region across from the thick oxide block. Because of the benefits provided by this raised-terrace configuration, the requirement of controlling the horizontal critical dimensions is relieved by a horizontal-to-vertical translation. Those of ordinary skill in the art is provided with a novel technique to shrink the cell size horizontally for higher cell density by applying the device structure disclosed in this invention. In addition to the advantages provided by this horizontal-to-vertical translation of critical dimension tolerance control, the sidewall spacer gate further provide simplified manufacture processes as will be further described below when the processing steps are described in more details.

The MOSFET cell 202 as that shown in FIG. 5A provides several advantages. It has a strengthened punch through prevention with the punch through prevention region 245 and also achieving a lower JFET resistance by providing a JFET resistance reduction region 212 extending traversally between the p-body region 240. The transistor cell 202 further provides faster switching speed because the capacitance between the gate and drain $C_{GD}$ is reduced with the thick oxide block 215' disposed underneath the polysilicon gate 230. Most significantly, the cell density can be further increased by reducing the length of the polysilicon gate 230 without being limited by the technical difficulty that the body dopant may diffuse into the region underneath the oxide block 215' thus causing high threshold voltage. Furthermore, as will be further discussed below, the length of the polysilicon layer 230 can be further reduced with a self adjustment and self alignment feature in applying an open dry etch to the polysilicon gate 230 where the top portion of the gate 230 is totally removed and only the sidewall spacer portions are kept. Such configuration provides a self-adjustment of the width of the polysilicon sidewall gate and in self alignment in forming the body regions 240 whereby the critical dimension tolerance of the gate width and the allowance for misalignment for forming the p-body can all be reduced. Semiconductor power device with higher density can be achieved with such self alignment structural features. These advantages can be better appreciated by referring to the detail description of the processing steps for fabricating the MOSFET device provided below. A process flow is employed for fabricating the MOSFET device wherein the requirement of polysilicon mask may be removed whereby cost savings of manufacture the MOSFET device are also achieved.

Figure 5C:
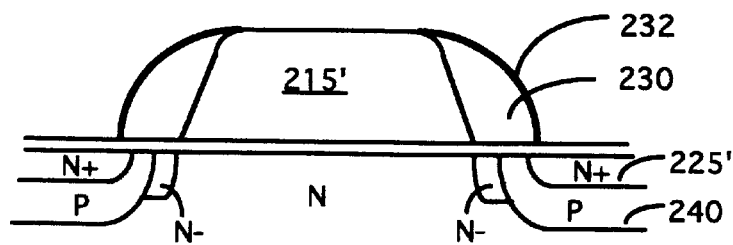

Referring to FIGS. 5B and 5C for two similar transistor cells as that shown in FIG. 5A. In FIG. 5B, the MOSFET device has no punch through prevention region because the width of the polysilicon gate 230 is further reduced and the p-body now extends to the region directly under the edge of the oxide block 215'. In FIG. 5C, the oxide block 215' is supported on a top surface on the epitaxial layer 210 which is on the same level as the top surface of the source region 215' and the body region 240. The etch process in removing the initial oxide is controlled to remove the uncovered oxide layer only without etching into the epitaxial layer 210. This structural feature may be more desirable with simplified etching step when the sidewall gate 230 can provide sufficient width greater or equal to the lateral diffusion length of the body dopant without requiring the anisotropic etch to form a raised silicon terrace as described before. By forming the sidewall spacer gate 230 to have a width greater than or equal to the lateral diffusion length of the p-body dopant ions, the p-body regions 240 is prevented from extend beyond the distance of the sidewall gate 230. The technical difficulty where the p-body 240 is caused to laterally diffuse in the epitaxial layer 210 into a region below the thick oxide block 215' thus causing a high threshold voltage is now resolved by controlling the processing parameters to precisely adjust the relative position of the p-body region 240 without having to satisfy the stringent alignment requirements.

Figure 6A:
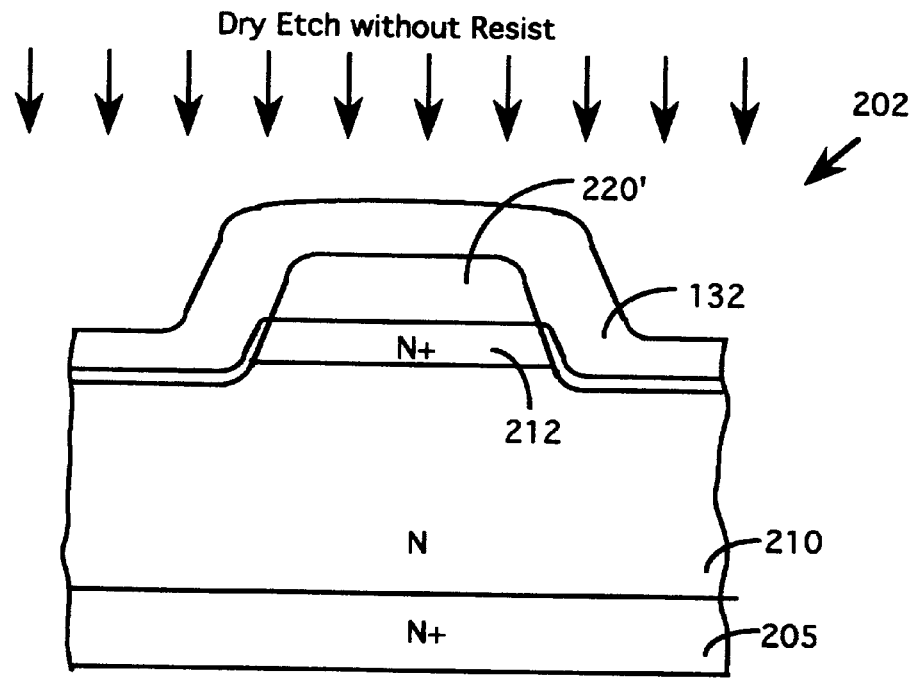
FIGS. 6A to 6D are a series of cross sectional views for illustrating the processing steps for fabricating a MOSFET device of FIG. 5A.
Figure 6B:
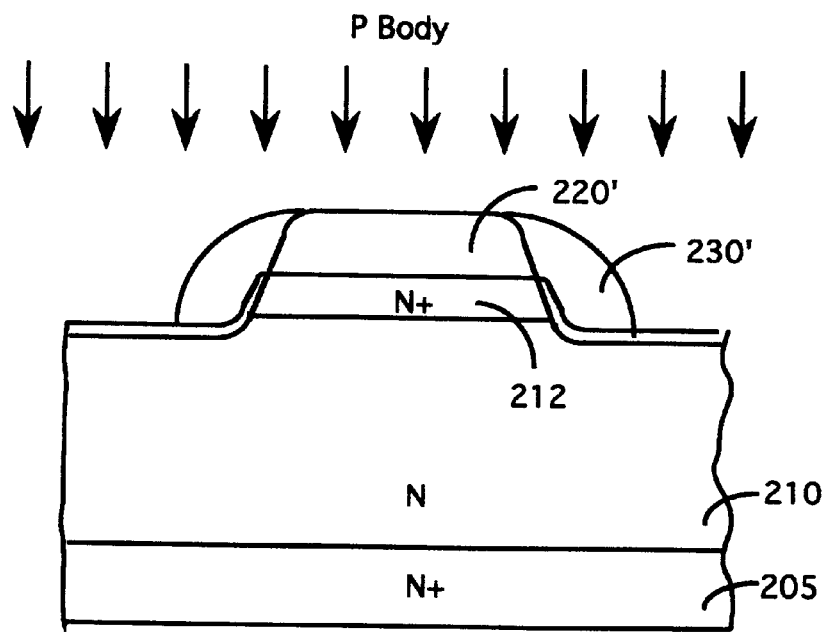

Please refer to FIGS. 6A to 6D for the processing steps for manufacturing the power MOSFET device 200 includes a plurality of transistor cells 202 described above. As shown in FIG. 6A, an anisotropic etch is carried out to remove the entire polysilicon layer 230 except the sidewall spacer 230' surrounding the oxide block 220'. The sidewall spacer 230' thus function as the gate for the MOSFET transistor cell. The width of the polysilicon sidewall spacer gate 230' depends on the etching depth, i.e., depth $\delta$, etched into the silicon and the time for applying the dry etch. The width of the sidewall spacer gate 230' is therefore automatically-adjusted depending on the dry etch process and the depth $\delta$. Typically, the greater the depth $\delta$, the wider is the sidewall spacer gate 230'. Then, a p-body implant at 30–100 Kev with a boron ion-beam of $3\times10^{13}$ to $3\times10^{14}/cm^2$ flux density is carried out to form the p-body region 240 as that shown in FIG. 6B. A p-body diffusion process is then carried out at an elevated temperature of 1,000–1,200° C. for ten minutes to three hours to increase the depth of the p-body region 240 to 1.0–2.0 $\mu$m. With the sidewall spacer gate 230', the formation of the p-body 240 is a self aligned. Furthermore, the relative positions of the p-body 240 and the gate 230' are automatically adjusted through controlling the process parameters. The structural profile of the MOSFET cell can be precisely controlled by adjusting the depth of the depth $\delta$, the time of dry etch in forming the sidewall spacer gate 230', the energy of the p-body implant, and the time and temperature for p-body diffusion. The manufacture processes are greatly simplified because the stringent alignment requirements for manufacturing the transistor cells of reduced sizes are removed. Savings of manufacture time and cost are achieved by employing the self-aligned and process-adjusted manufacture processes. As discussed above, when the JFET reduction region 212 formed as a raised terrace, the requirements for controlling the horizontal critical dimensions are translated to the control of the vertical critical dimensions. Further reduction of transistor cells is achievable when the novel structure and manufacture process are implemented.

Figure 6C:
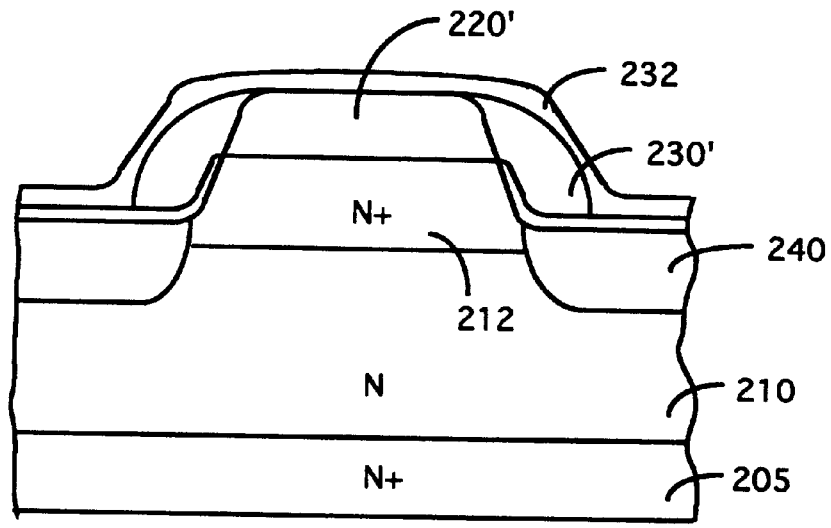
Figure 6D:
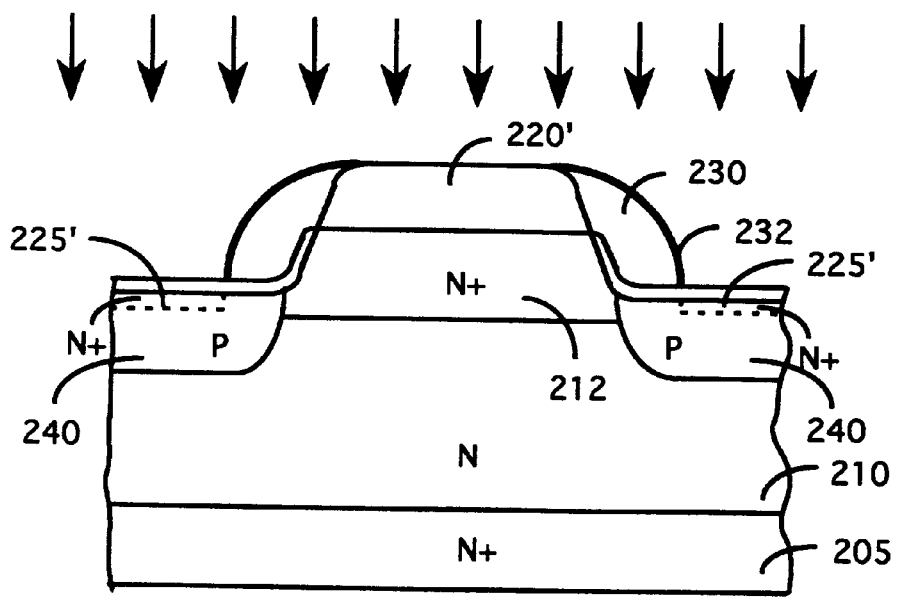

Referring to FIG. 6C, after the photo-resist for gate etching process is stripped, a refractory metal layer such as titanium layer with a thickness ranging from 500 to 1,000 Å is deposited over the entire top surface. In FIG. 6F, titanium silicide layer 232 is formed on top of the polysilicon gate 230 by using a rapid thermal anneal (RTA) process at 650–700° C. in a nitrogen gas. The un-reacted titanium is then removed by a hydrogen peroxide. The resistance of the silicide layer 232 is further reduced by annealing the wafers at 800–900° C. in an argon gas and then the source regions are formed by source implant followed by standard manufacture processes to complete the manufacture of the transistor cells with details of process steps describe above.

Figure 7:
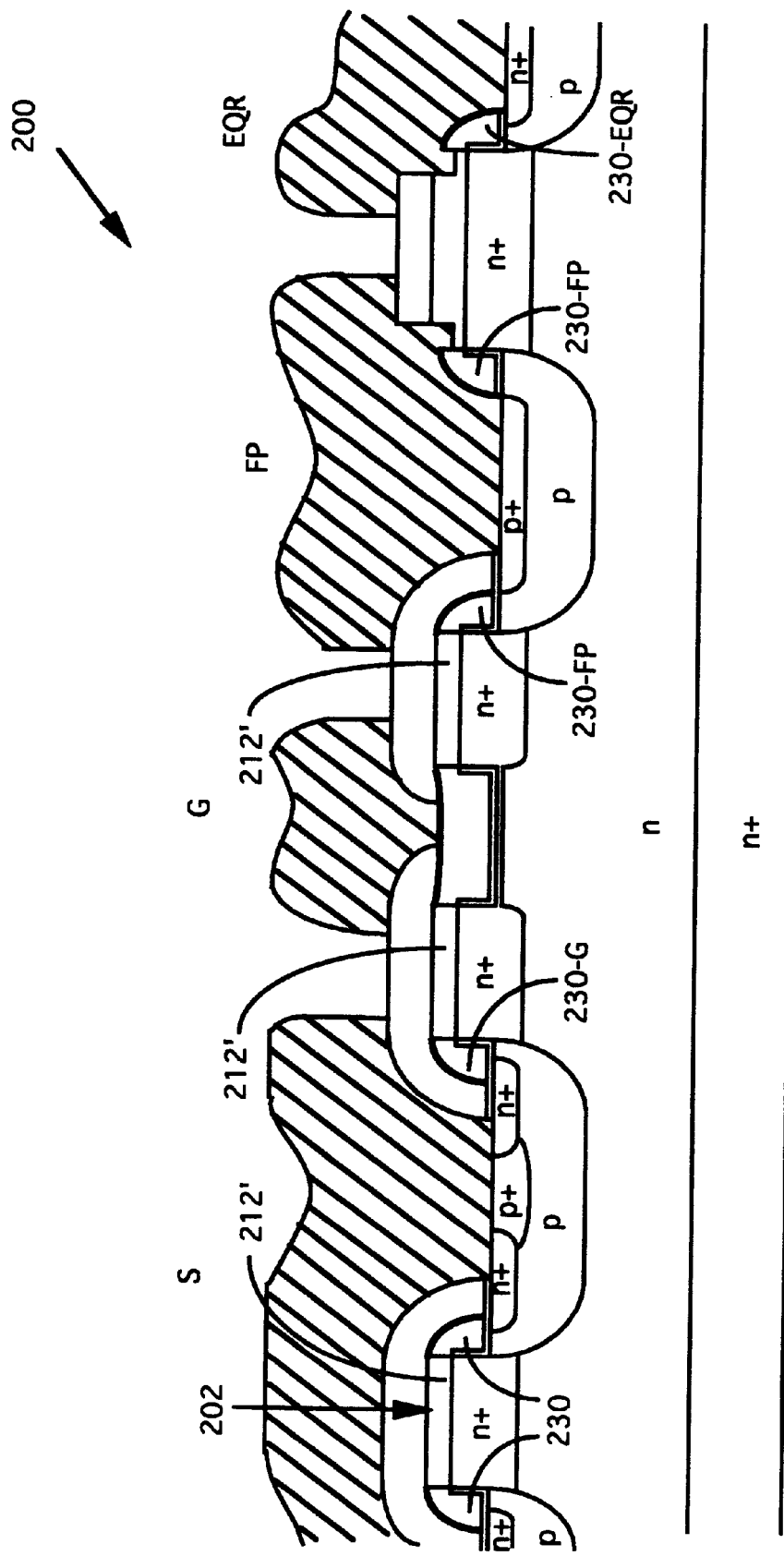
FIG. 7 is a cross sectional view of a MOSFET device manufactured by the process as shown in FIGS. 6A to 6E wherein a polysilicon mask is no longer required.

With the transistor cell 202 as that shown in FIGS. 5A to 5C and manufactured by the processing steps shown in FIGS. 6A to 6D, the manufacture processes can be further simplified by eliminating the requirement of applying a polysilicon mask. Please refer to FIG. 7 for a cross sectional view of the MOSFET device 200 which includes a transistor cell 202 as that shown in FIG. 5A. The device structure as that shown can be manufactured without using a polysilicon mask. This is achieved by configuring the active mask such that the placement of the oxide blocks 212' are specially arranged near the gate contact (G), the field plate contact (FP), and the equal potential ring contact (EQR). A plurality of sidewall spacers, e.g., 230-G near the gate contact G, 230-FP near the field plate contact, and 230-EQR near the equal potential ring (EQR) are formed when a blank dry etch is applied to a polysilicon layer without a polysilicon mask. A silicide layer then formed on top of these sidewall spacers followed by standard processes of forming the BPSG layer and then the contacts. Simplified manufacture process and cost savings are achieved when the novel device structure can be manufactured without using a polysilicon mask.

Figure 8:
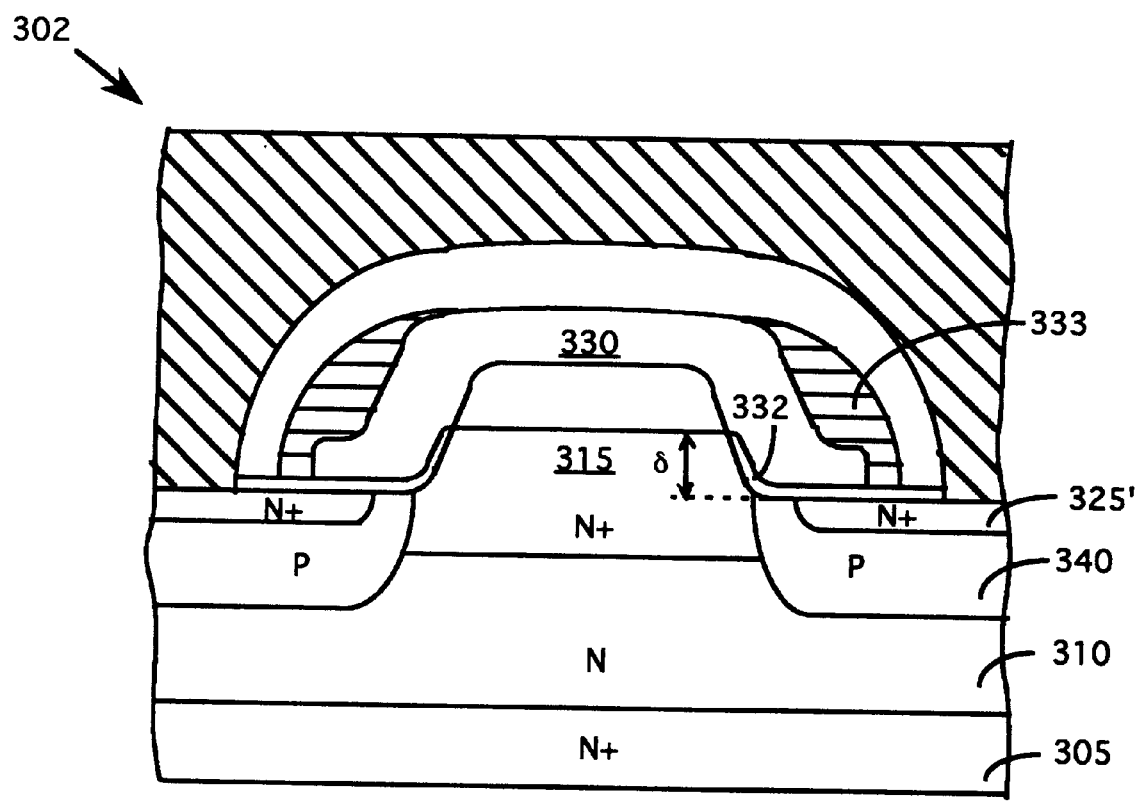
FIG. 8 is a cross sectional view of an alternate preferred embodiment of the present invention wherein an oxide or nitride sidewall spacer around the gates are implemented for self-alignment of p-body formation.

Referring to FIG. 8 for an alternate preferred embodiment for a transistor cell 302 of the present invention. The transistor cell 302 is similar to the transistor cell 102 as that shown in FIG. 3. An exemplary N-channel MOSFET transistor cell 302 as part of a MOSFET device is depicted. The MOSFET transistor cell 302 is formed on a $N^+$ substrate 305 supporting a N epitaxial layer 310 thereon. The $N^+$ substrate serves as a common drain for the transistor cells 302. The MOSFET transistor cell 302 includes a lower-outer p-body region 340 which defines an outer boundary of the cell 302. A shallower $N^+$ source region 325' is formed inside the p-body region 340 adjacent to the outer boundary of the transistor cell 302. In the central potion of the transistor cell, a $N^+$ doped JFET resistance reduction region 315 extends laterally between the outer p-body region 340.

Similar to the structural features of the transistor cell 102 as that shown in FIG. 3 with a central portion of the transistor cell 302 includes the JFET resistance reduction region 315 and the portion of the epitaxial layer 310 underneath form a raised terrace with a vertical height $\delta$ above the top surface of other areas of the epitaxial layer 310. The raised silicon terrace supports an oxide block 320' with a polysilicon gate 330 overlying the oxide block 320'. With the raised terrace as shown, there is a portion of the thin gate oxide layer 332 underneath the gate 330 along the edge of the raised terrace which is in close contact with the p-body region 340. There is extra margin, by providing a thin gate oxide layer 332 along the edge portions of the raised terrace, for the p-body region 340 to extend toward the region under gate while being prevented from extending to be directly across from the thick oxide blocks thus causing the threshold voltage to increase. Therefore, the manufacture requirement to control the critical dimensions typically along a horizontal direction are now translated to a vertical critical dimension requirement to control the vertical height of the terrace δ to assure that sufficient edge portion is maintain without the difficult of raising the threshold voltage assuming a worst misalignment error has occurred. By translating a horizontal critical dimension requirement to a vertical critical dimension requirement, the size of the transistor can be further reduced to increase the cell density without being limited by the manufacture capability of controlling the horizontal critical dimensions. Just like the description provided above, this structural profile is achieved by applying an anisotropic etching to the polysilicon layer 330 with the vertical etching rate much greater than the horizontal etching rate.

In addition to the raised terrace for translating the horizontal critical dimension tolerance to a vertical critical dimension tolerance, the gate is further surrounded by a sidewall spacer 333. The sidewall spacer 333 serve as self aligned block where the p-body dopants are blocked away from the JFET region under the gate 330. It provided the advantage that the cell size can be further reduced by reducing the width of the gate without the concern that the p-body dopant, blocked by the sidewall spacer 333, would encroach into the JFET region thus causing the JFET resistance to increase or even diffuse over the entire width over the region under the gate and cause the transistor cell 302 to lose its transistor functions.

The transistor cell 302 is manufactured by applying a process flow identical to that employed to manufacture the transistor cell 302. An additional step is carried out after the anisotropic etch step of forming the polysilicon gate 330 and before the implant of the p-body regions 340. An undoped low temperature oxide (LTO) or nitride layer is deposited over the entire surface of the wafer to a thickness ranging from three-thousand to six-thousand angstroms (3000–6000 Å). An anisotropic dry etch is performed without mask to vertically etch oxide layer 115 so as to leave oxide or nitride spacer region 333 on the sidewalls of the gate 330. The sidewall spacer width is strongly dependent on the total thickness of the polysilicon gate 330 plus the thickness of the oxide block 320 and the height of the raised terrace. The sidewall spacer width further depends on the thickness of the overlying oxide or nitride layer. The sidewall spacers 333 acts as a mask for an implantation step to be carried out subsequently wherein p-type boron ion beam are implanted to form the p-body regions 340. The p-type boron implantation is performed and a p-body diffusion process is then carried out at an elevate temperature. The source region is formed after the p-body diffusion with arsenic or phosphorous implant through a source mask The manufacture of the transistor cell is completed by applying standard processes of forming the BPSG layer and then the contacts. Higher cell density is achieved with the novel device structure when the width of the polysilicon gates can be further reduced by taking advantage of controllability of the spacing between the p-body regions under the gate when the sidewall spacers are implemented a body dopant blocks.

Therefore, a novel MOSFET structure, and fabrication process are disclosed in the present invention to overcome the difficulties and limitations encountered in the prior art. Specifically, a novel and improved MOSFET structure and fabrication process are provided in this invention to implement the structural features for punch through prevention and reduction of JFET resistance without being limited by a potential concern that the threshold voltage may be increased due to structural deviations of the body regions caused by cell size reduction or errors induced by mask misalignments. By controlling the width of a sidewall around a gate, the potential problems of threshold voltage increase due to structural deviations of the body regions are eliminated when the sidewalls are used to assure the body regions will not diffuse into region right under a thick oxide block. In an alternate embodiment, a self-adjusting and self alignment sidewall gate structure are provided to eliminate the potential concern of threshold voltage increase due to structural deviations of the body regions caused by cell size reduction or errors induced by mask misalignment are eliminated. The self-adjusting and self alignment sidewall gate structure is manufactured by a simplified fabrication process without requiring a polysilicon mask whereby the improved device can be manufactured without increasing the production costs. Finally, by providing a self-adjusting and self alignment sidewall gate structure the cell size can be further reduced without being limited by a requirement of allowing extra gate lengths to compensate the error induced by mask misalignments.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A MOSFET transistor supported on a substrate comprising:

an epitaxial-layer of a first conductivity type near a top surface of said substrate defining a drain region therein;

an oxide block supported on a raised silicon terrace of said epitaxial layer disposed in a central portion of said transistor above a JFET reduction region of a first conductivity type of higher dopant concentration than said epitaxial layer;

a lower-outer body region of a second conductivity type surrounding said JFET reduction region disposed near said top surface and defining a boundary of said MOSFET transistor;

a source region of said first conductivity type enclosed in said lower-outer body region disposed near said top surface and extended to said transistor boundary;

a thin gate oxide layer overlying said top surface of said substrate and an edge of said raised oxide terrace; and a polysilicon gate overlaying said oxide block and said silicon terrace, said gate further covering an area above said source region and said body region insulated by said gate oxide layer therefrom.

2. The MOSFET transistor of claim 1 wherein:

said raised silicon terrace has a height ranging from 2000 to 8000 Angstroms.

3. The MOSFET transistor of claim 1 further comprising:

a punch through prevention zone disposed between said body region and said JFET reduction region wherein said punch prevention zone being of said first conductivity type containing less dopant concentration than said epitaxial layer.

4. The MOSFET transistor of claim 1 wherein:

said epitaxial-layer of a first conductivity type is a N-type epitaxial-layer; and said lower-outer body region of a second conductivity type is a P-type body to constitute a N-channel MOSFET transistor.

5. The MOSFET transistor of claim 1 wherein:

said lower-outer body region extends in said epitaxial layer to a region under said raised silicon terrace near an edge portion of said raised silicon terrace across from said gate insulated by said thin oxide layer covering thereon whereby said body region being prevented from touching said oxide block under said gate and said MOSFET transistor is prevented from having a high threshold voltage resulted therefrom.

6. A MOSFET transistor supported on a substrate comprising:

an epitaxial-layer of a first conductivity type near a top surface of said substrate defining a drain region therein;

an oxide block supported on a raised silicon terrace of said epitaxial layer disposed in a central portion of said transistor above a JFET reduction region of a first conductivity type of higher dopant concentration than said epitaxial layer;

a lower-outer body region of a second conductivity type surrounding said JFET reduction region disposed near said top surface and defining a boundary of said MOSFET transistor;

a source region of said first conductivity type enclosed in said lower-outer body region disposed near said top surface and extended to said transistor boundary;

a thin gate oxide layer overlying said top surface of said substrate and an edge of said raised oxide terrace; and a polysilicon sidewall spacer surrounding said oxide block and said raised silicon terrace wherein said sidewall spacer constituting a gate and covering said thin oxide layer on an edge portion of said raised silicon terrace and said gate further covering an area above said source region and said body region insulated by said gate oxide layer therefrom.

7. The MOSFET transistor of claim 6 wherein:

said raised silicon terrace has a height ranging from 2000 to 8000 Angstroms.

8. The MOSFET transistor of claim 6 further comprising:

a punch through prevention zone disposed between said body region and said JFET reduction region wherein said punch prevention zone being of said first conductivity type containing less dopant concentration than said epitaxial layer.

9. The MOSFET transistor of claim 6 wherein:

said epitaxial-layer of a first conductivity type is a N-type epitaxial-layer; and said lower-outer body region of a second conductivity type is a P-type body to constitute a N-channel MOSFET transistor.

10. The MOSFET transistor of claim 1 wherein:

said lower-outer body region extends in said epitaxial layer to a region under said raised silicon terrace near an edge portion of said raised silicon terrace across from said gate insulated by said thin oxide layer covering thereon whereby said body region being prevented from touching said oxide block and said MOSFET transistor is prevented from having a high threshold voltage resulted therefrom 11. A MOSFET transistor supported on a substrate comprising:

an epitaxial-layer of a first conductivity type near a top surface of said substrate defining a drain region therein;

an oxide block supported on a raised silicon terrace of said epitaxial layer disposed in a central portion of said transistor above a JFET reduction region of a first conductivity type of higher dopant concentration than said epitaxial layer;

a lower-outer body region of a second conductivity type surrounding said JFET reduction region disposed near said top surface and defining a boundary of said MOSFET transistor;

a source region of said first conductivity type enclosed in said lower-outer body region disposed near said top surface and extended to said transistor boundary;

a thin gate oxide layer overlying said top surface of said substrate and an edge of said raised oxide terrace;

a polysilicon gate overlaying said oxide block and said silicon terrace, said gate further covering an area above said source region and said body region insulated by said gate oxide layer therefrom;

a gate sidewall spacer surrounding said gate constituting a body-implant alignment block.

12. The MOSFET transistor of claim 11 wherein:

said raised silicon terrace has a height ranging from 2000 to 8000 Angstroms.

13. The MOSFET transistor of claim 11 further comprising:

a punch through prevention zone disposed between said body region and said JFET reduction region wherein said punch prevention zone being of said first conductivity type containing less dopant concentration than said epitaxial layer.

14. The MOSFET transistor of claim 1 wherein:

said sidewall spacer surrounding said gate having a maximum width ranging from 2000 to 8000 Angstroms.

15. The MOSFET transistor of claim 11 wherein:

said gate and said sidewall spacer surrounding said gate having a total width ranging from 0.6 to 1.2 micrometers; and said lower-outer body region extends in said epitaxial layer to a region under said raised silicon terrace near an edge portion of said raised silicon terrace across from said gate insulated by said thin oxide layer covering thereon whereby said body region being prevented from touching said oxide block under said gate and said MOSFET transistor is prevented from having a high threshold voltage resulted therefrom.

16. A power transistor on a processed substrate containing dopants of a first conductivity type therein, said transistor comprising:

an oxide block supported on a raised silicon terrace of said processed substrate disposed in a central portion of said transistor;

a gate disposed over said oxide block and said silicon terrace and extending over a top surface of said processed substrate above a body and a source regions contained therein.

17. The power transistor of claim 16 further comprising:

a JFET reduction region disposed in said processed substrate below said silicon terrace wherein said JEFET reduction region is of said first conductivity type with higher dopant concentration than said processed substrate.

18. The power transistor of claim 16 wherein:

said gate constituting a sidewall spacer surrounding said oxide block and said raised silicon terrace wherein said gate covering a thin oxide layer on an edge portion of said raised silicon terrace.

19. The power transistor of claim 16 further comprising:

a gate sidewall spacer surrounding said gate constituting a body-implant alignment block.

20. The power transistor of claim 19 further comprising:

said gate and said sidewall spacer surrounding said gate having a total width ranging from 0.6 to 1.2 micrometers; and said body region extends in said epitaxial layer to a region under said raised silicon terrace near an edge portion of said raised silicon terrace across from said gate insulated by said thin oxide layer covering thereon whereby said body region being prevented from touching said oxide block under said gate and said MOSFET transistor is prevented from having a high threshold voltage resulted therefrom.

* * * * *